United States Patent
Pribbernow

(10) Patent No.: US 7,451,426 B2
(45) Date of Patent: Nov. 11, 2008

(54) APPLICATION SPECIFIC CONFIGURABLE LOGIC IP

(75) Inventor: Claus Pribbernow, Munich (DE)

(73) Assignee: LSI Corporation, Milpitas, CA (US)

( * ) Notice: Subject to any disclaimer, the term of this patent is extended or adjusted under 35 U.S.C. 154(b) by 372 days.

(21) Appl. No.: 11/176,514

(22) Filed: Jul. 7, 2005

(65) Prior Publication Data
US 2007/0011642 A1 Jan. 11, 2007

(51) Int. Cl.
G06F 17/50 (2006.01)

(52) U.S. Cl. .............................. 716/18; 716/16; 716/17; 703/14; 703/15; 703/16; 326/37; 326/38; 326/39

(58) Field of Classification Search ............. 716/16–18; 703/14–16; 326/37–39
See application file for complete search history.

(56) References Cited

U.S. PATENT DOCUMENTS

| 6,567,957 | B1* | 5/2003 | Chang et al. ................. 716/4 |
| 6,732,354 | B2* | 5/2004 | Ebeling et al. ............... 717/119 |
| 6,785,876 | B2* | 8/2004 | Takemura ..................... 716/7 |
| 6,959,428 | B2* | 10/2005 | Broberg et al. ............... 716/18 |
| 7,012,448 | B2* | 3/2006 | Parkes ......................... 326/41 |
| 7,051,309 | B1* | 5/2006 | Crosetto ..................... 716/10 |
| 7,072,818 | B1* | 7/2006 | Beardslee et al. ............ 703/14 |
| 7,131,098 | B2* | 10/2006 | Darringer et al. ............ 716/18 |
| 7,200,703 | B2* | 4/2007 | Valmiki et al. .............. 710/306 |
| 7,212,961 | B2* | 5/2007 | Settles ......................... 703/23 |
| 7,237,214 | B1* | 6/2007 | Pandey et al. ................. 716/7 |
| 7,240,303 | B1* | 7/2007 | Schubert et al. .............. 716/4 |
| 7,290,224 | B2* | 10/2007 | Byrn et al. .................... 716/1 |
| 2004/0141518 | A1* | 7/2004 | Milligan et al. ............. 370/463 |
| 2005/0010378 | A1* | 1/2005 | Zeidman et al. ............. 703/1 |
| 2005/0023656 | A1* | 2/2005 | Leedy ......................... 257/678 |
| 2005/0165995 | A1* | 7/2005 | Gemelli et al. .............. 710/305 |
| 2005/0229143 | A1* | 10/2005 | Gehman et al. .............. 716/18 |
| 2006/0236292 | A1* | 10/2006 | Delp et al. ................... 716/16 |

OTHER PUBLICATIONS

Garp: A MIPS Processor with a Reconfigurable Coprocessor; John R. Hauser and John Wawrzynek, University of California, Berkley.

* cited by examiner

Primary Examiner—Thuan Do
Assistant Examiner—Naum B Levin
(74) Attorney, Agent, or Firm—Suiter Swantz pc llo

(57) ABSTRACT

An application specific configurable logic IP module includes (1) a system level configuration controller; (2) at least one standardized interconnect communicatively coupled to the system level configuration controller; (3) at least one standardized configuration port for programming the application specific configurable logic IP module; (4) an embedded programmable logic fabric, communicatively coupled to the system level configuration controller and the at least one standardized interconnect, for mapping arithmetic functions into standard cells; (5) at least one scalable configurable logic module; and (6) a programmable routing matrix. The system level configuration controller is suitable for selecting a standard for the at least one standardized interconnect, the at least one standardized configuration port, and a number of embedded programmable logic functions, and for controlling the programmable routing matrix.

16 Claims, 6 Drawing Sheets

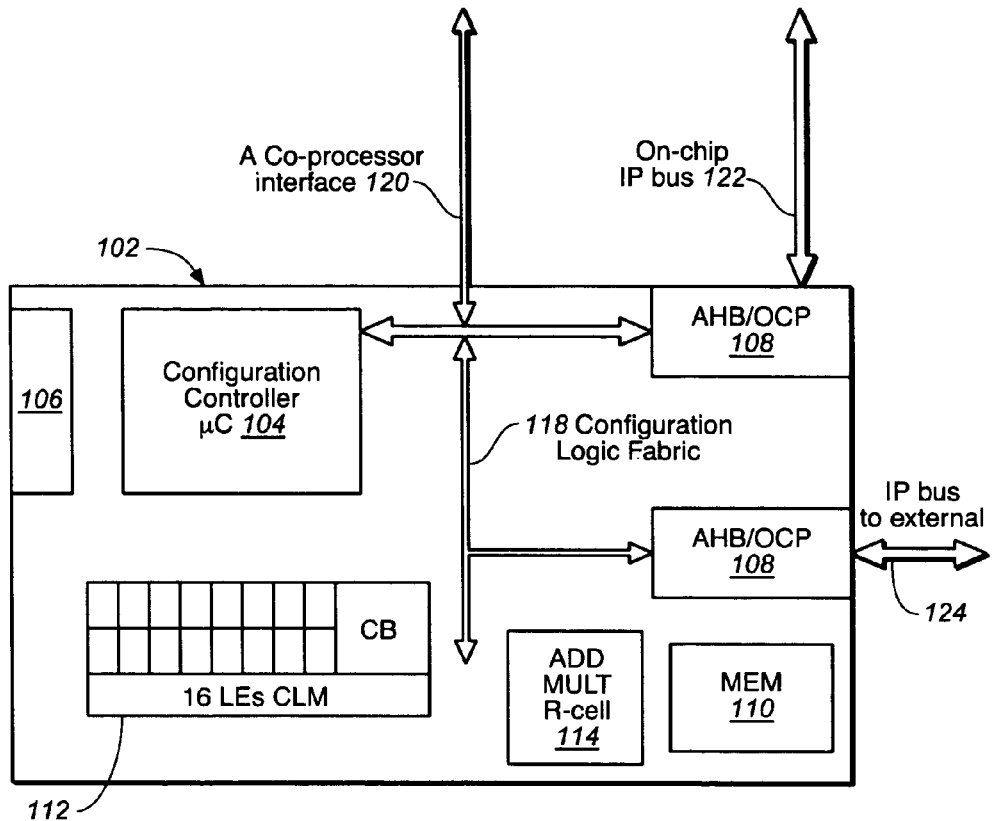
FIG._1
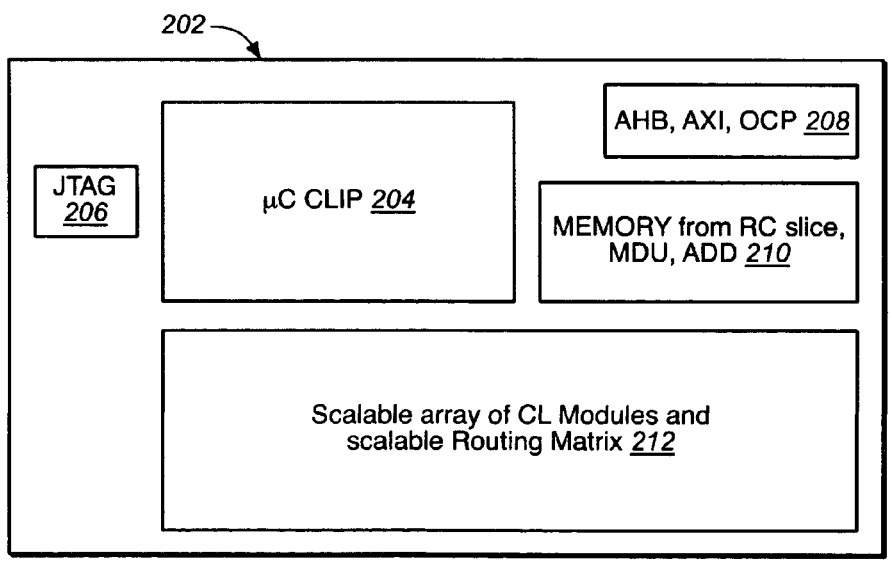
FIG._2

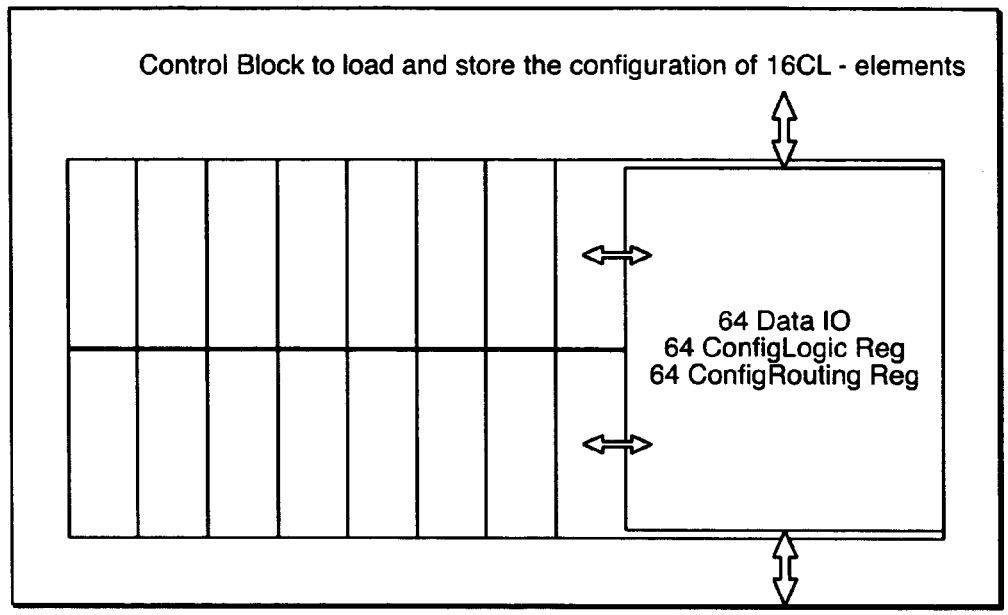
FIG._3
| F[3:0] | Logic Mode A=0 | | Arithmetic Mode A=1 | |
|---|---|---|---|---|
| 0000 | ZERO | 0 | SHL | 2*A+C |
| 0001 | NOR | (A/B)' | - | undefined |
| 0010 | INHA | A'&B | - | undefined |
| 0011 | NOTA | A' | DEC | A-C' |
| 0100 | INHB | A&B' | - | undefined |
| 0101 | NOTB | B' | - | undefined |
| 0110 | XOR | A^B | ADD | A+B+C |
FIG._4

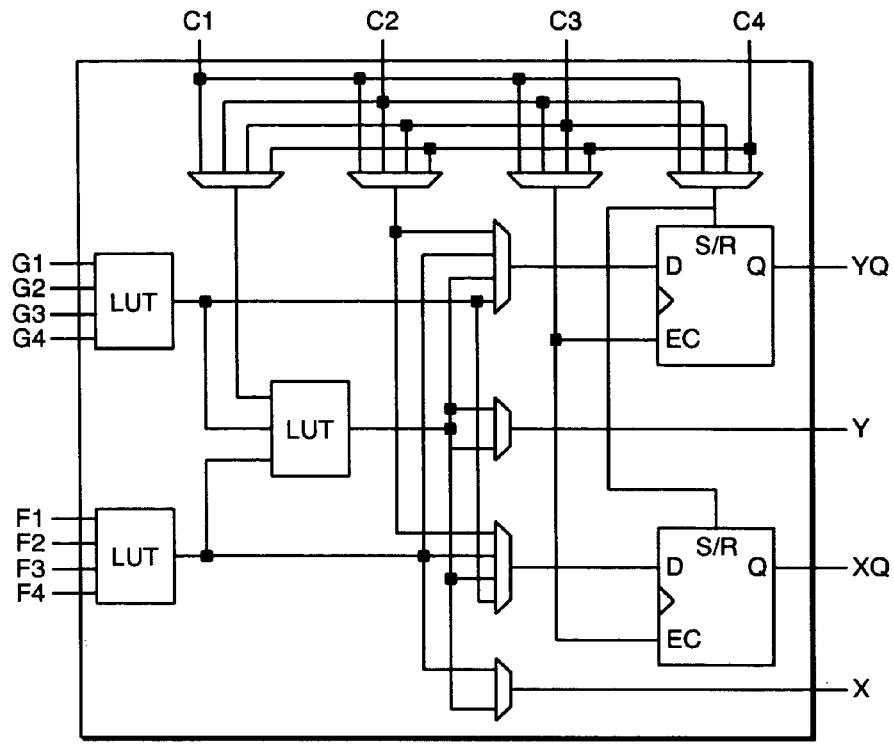
FIG._5
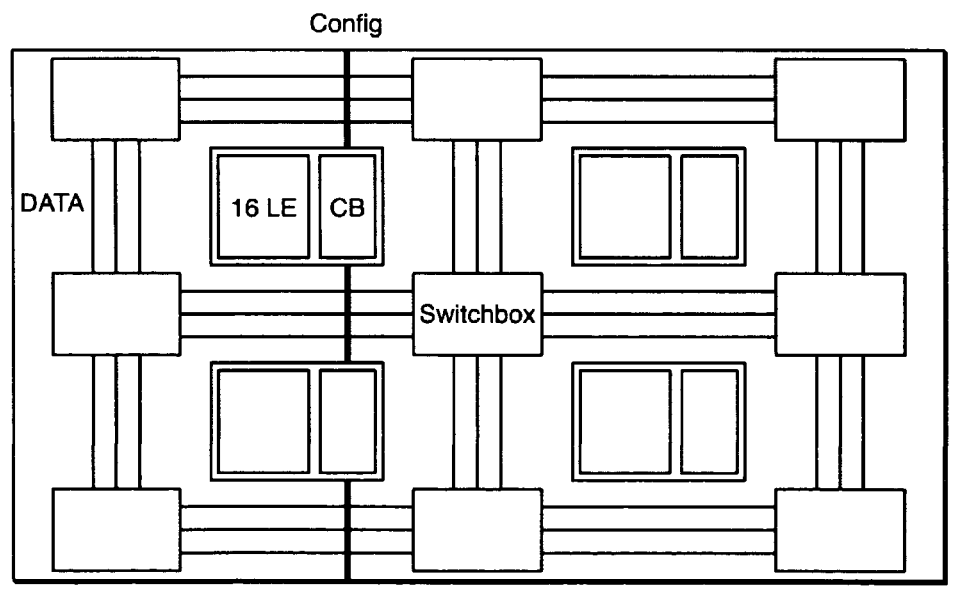
FIG._6

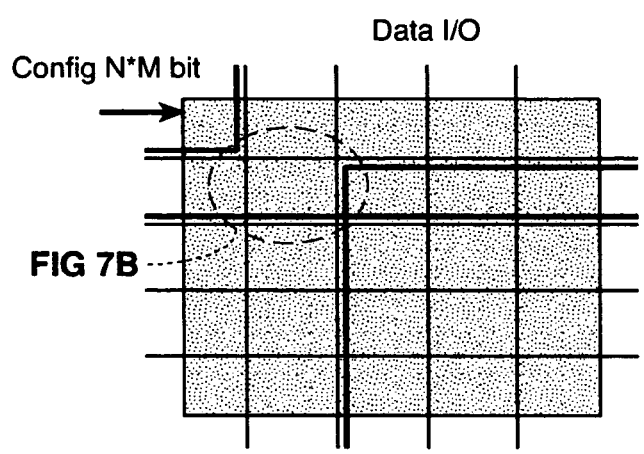 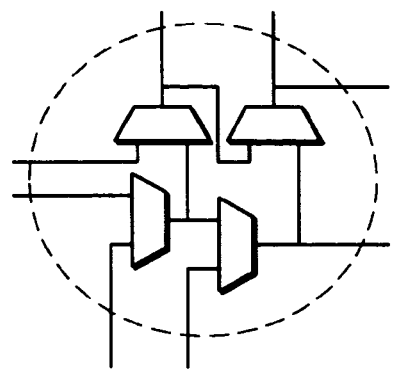
FIG._7A         FIG._7B

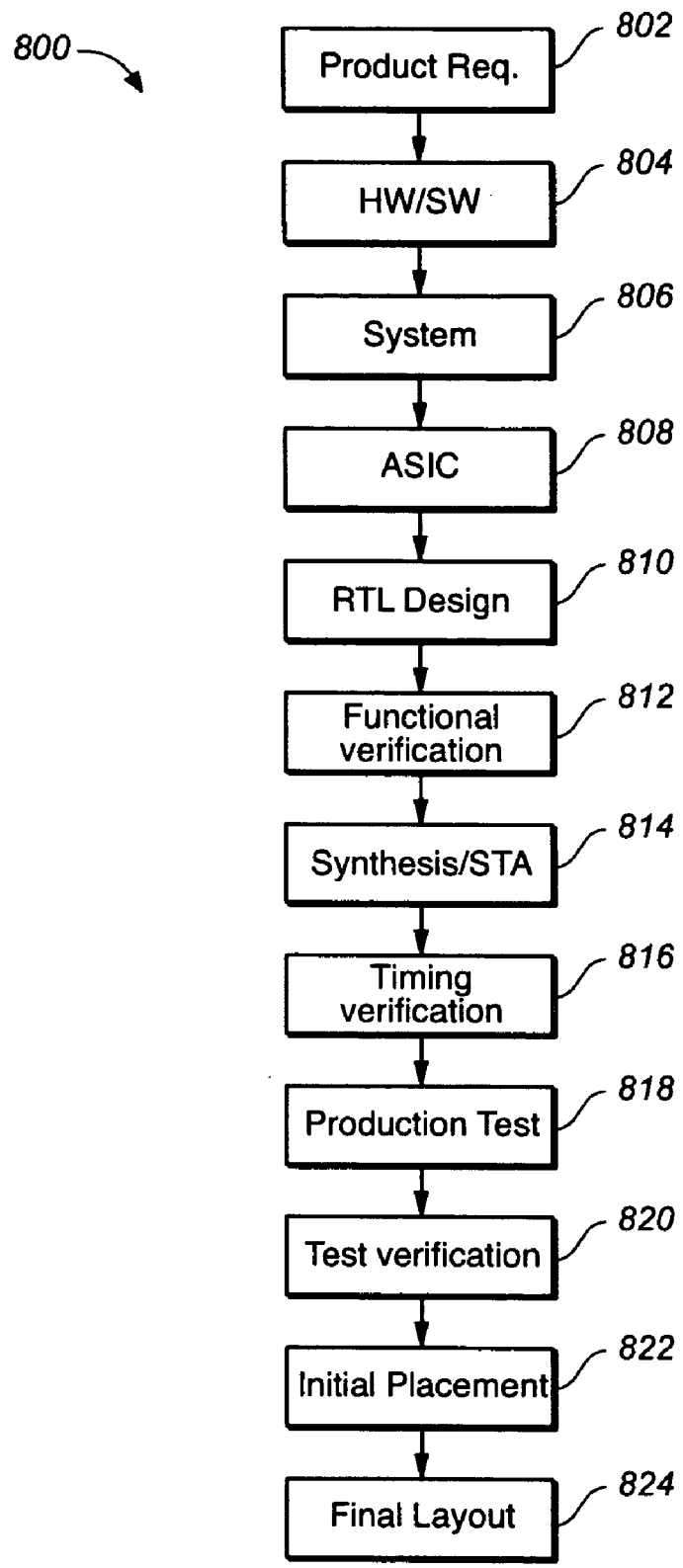
FIG._8

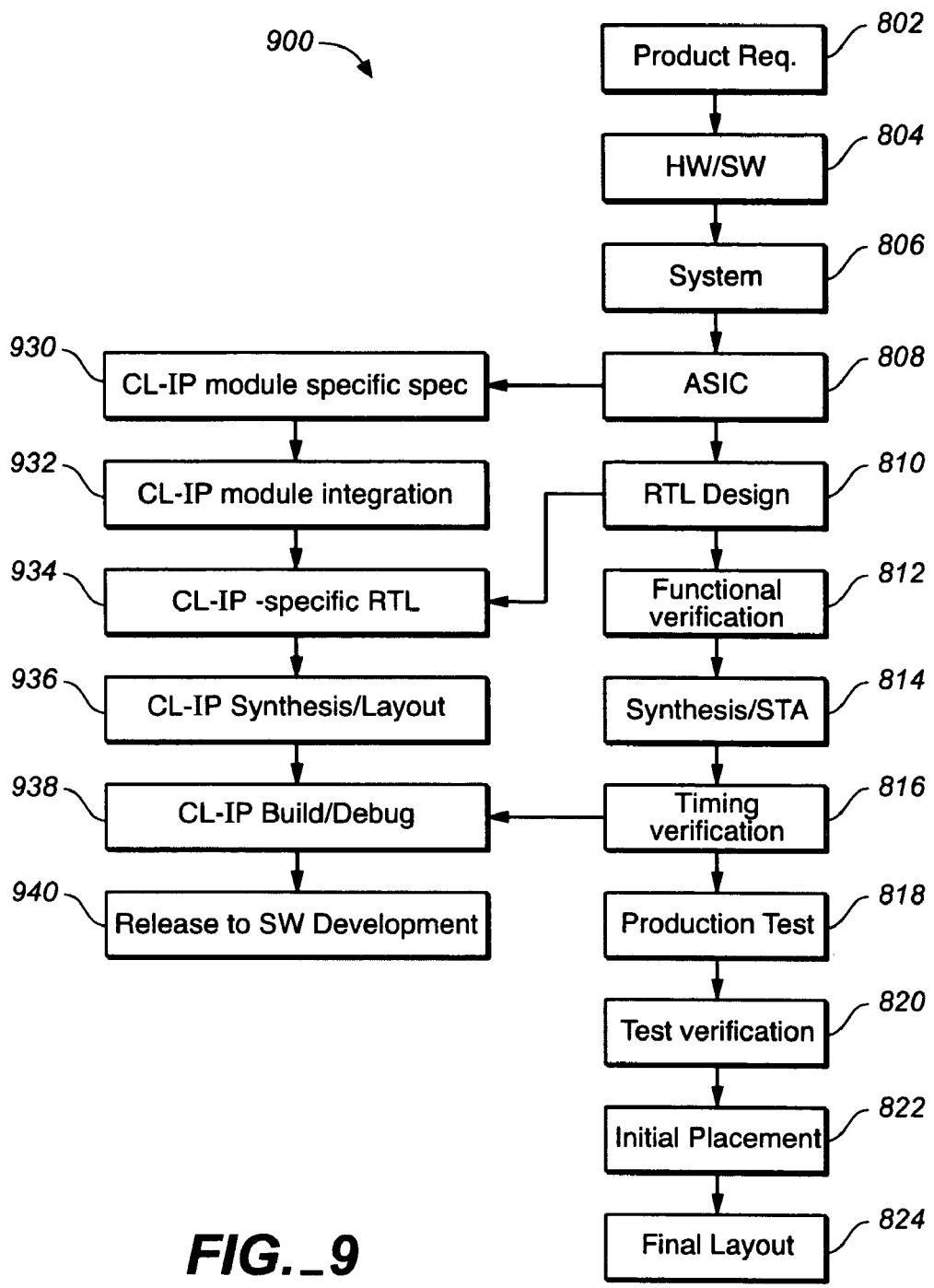
FIG._9

APPLICATION SPECIFIC CONFIGURABLE LOGIC IP

CROSS-REFERENCE TO RELATED DOCUMENTS

The present application herein incorporates U.S. patent application Ser. No. 11/079,439, entitled "Base Platforms With Combined ASIC And FPGA Features And Process Of Using Same", filed Mar. 14, 2005 by reference in its entirety.

FIELD OF THE INVENTION

The present invention generally relates to the field of integrated circuits, particularly to application specific configurable logic intellectual property (IP).

BACKGROUND OF THE INVENTION

Integrated circuits are generally fabricated on a thin silicon wafer or substrate. Semiconductor devices and electrical interconnections that form the integrated circuit are conventionally made by building many mask layers on top of one another on the substrate. Each successive mask layer may have a pattern that is defined using a mask. A mask has a shape used for patterning features in a particular process step during fabrication. The mask layers are fabricated through a sequence of pattern definition steps using the masks, which are interspersed with other process steps such as oxidation, etching, doping and material deposition. When a mask layer is defined using a mask chosen or provided by a customer, the mask layer is programmed or customized.

The lowest, "base" layers of an integrated circuit include the active areas of the semiconductor devices, such as diffusion regions and gate oxide areas, and desired patterns of the poly-silicon gate electrodes. One or more metal and insulating layers are then deposited on top of the base layers and patterned to form conductive segments, which interconnect the various semiconductor devices formed in the base layers. Electrical contacts or vias are formed to electrically connect a conductive segment of one of the metal layers with a conductive segment or semiconductor device on one of the other layers on the wafer.

Several types of integrated circuits have been developed which have modules or blocks of transistors that are partly fixed and partly programmable and/or customizable. The utility of these modular chips is determined by factors such as complexity, cost, time, and design constraints to create functional electronics from these generic blocks of transistors. Field Programmable Gate Array (FPGA) refers to a type of logic chip in which all mask layers are pre-fabricated by an Application Specific Integrated Circuit (ASIC) vendor and has a function that may be easily reprogrammed in the field with trivial modifications. FPGAs, however, are very large and have relatively high cost per function, relatively low speed, and high power consumption. An ASIC is an integrated circuit designed specifically for a particular application or use. In a fully programmable ASIC, all mask layers are programmed or customized by the logic designer. A typical example of a fully programmable ASIC is a cell-based ASIC (CBIC). While a fully programmable ASIC efficiently uses power and area as compared to FPGAs, it is very complex to design and prototype. In a semi-programmable ASIC, some, but not all, mask layers are programmable. For example, some or all of the base layers may be pre-fabricated by the ASIC vendor, and the remaining layers, such as the metal layers, may be programmed by the logic designer to interconnect the semiconductor elements to perform the desired function. A typical example of a semi-programmable ASIC is a gate-array-based ASIC. A semi-programmable ASIC may combine the high-density, high-performance benefits of standard-cell ASICs with the fast time-to-market and customization benefits of FPGAs.

Accordingly, semi-programmable ASICs have recently become more popular. Integrated circuit foundries have begun to develop standard, or base, platforms, known as "slices" containing the base layers of an integrated circuit but without the metal interconnection layers. The base layers are patterned to form gates that may be configured into cells using tools supplied by the foundry. The chip designer designs additional metal layers for the base platform to thereby configure the integrated circuit into a custom ASIC employing the customer's intellectual property (IP). An example of such configurable base platform is the RapidChip® (RC) platform available from LSI Logic Corporation of Milpitas, Calif. The RapidChip® platform permits the development of complex, high-density ASICs in minimal time with significantly reduced design and manufacturing risks and costs.

The design effort for a semi-programmable ASIC encompasses several stages. After the chip size has been selected and the input-output (I/O) cells have been placed in a layout pattern for the base platform, megacells, including memories and other large hard macros (hardmacs), are placed. Thereafter, standard cells are placed to complete the chip design.

Rapidly increasing mask costs and lengthening ASIC design cycles necessitate new solutions to produce custom logic devices on time and on budget. As fewer companies can make a business case for cell-based ASIC designs, they revert to less-costly options or try to replace custom logic devices with off-the-shelf Application Specific Standard Products (ASSP). FPGAs offer an alternative, but they come with significant drawbacks including limited performance and capacity, high unit costs and high power consumption.

This dilemma has caused a resurgence of gate-array style devices that are now being marketed as Structured ASICs, in an attempt to address the shortcomings of standard cell ASICs. On a system level, one way to achieve high integration efficiency and performance while providing flexibility is to combine discrete ASICs and FPGAs on a printed circuit board. Embedded FPGA technology may enable the combination of the flexibility and time-to-market of FPGAs with the capacity and performance of an ASIC.

Advanced 90 nm and 65 nm technology may make things worse again. While the mask charges may continue to increase and design time and tooling costs may spin out of control, every process node may make FPGA-based products more attractive. On the other hand, technology limits such as power consumption may make FPGA type devices much more complicated to develop and to integrate on the system level. Thus, both ASIC and FPGA type of devices may not serve the markets of the future.

The embedded FPGA technology may be a solution to address the foregoing-described problem. Conventionally developers of embedded FPGAs concentrate on a fixed technology driven embedded FPGA solution. However, the integration of such an embedded FPGA into System-on-Chip (SoC) designs may be difficult, ASIC design flows may be broken, and the flexibility on the SoC system level may be not addressed.

Thus, it would be desirable to provide a system and method which may effectively address the foregoing-described problems.

SUMMARY OF THE INVENTION

In an exemplary aspect, the present invention provides an application specific configurable logic IP module which includes (1) a system level configuration controller; (2) at least one standardized interconnect communicatively coupled to the system level configuration controller; (3) at least one standardized configuration port for programming the application specific configurable logic IP module; (4) an embedded programmable logic fabric, communicatively coupled to the system level configuration controller and the at least one standardized interconnect, for mapping arithmetic functions into standard cells; (5) at least one scalable configurable logic module; and (6) a programmable routing matrix. The system level configuration controller is suitable for selecting a standard for the at least one standardized interconnect, the at least one standardized configuration port, and a number of embedded programmable logic functions, and for controlling the programmable routing matrix.

In an additional exemplary aspect, the present invention provides a method for integrating a configurable logic IP module into an ASIC design flow. A specification of an integrated circuit product is received. Hardware and software partition is implemented based on the specification. Architecture of hardware for the integrated circuit product is obtained. ASIC partition is implemented based on the architecture of hardware to obtain ASIC elements and non-ASIC elements. A specific specification for the configurable logic IP module is provided. Integration of the configurable logic IP module is implemented. A RTL design for the ASIC elements is implemented to obtain an ASIC RTL. RTL enhancements for the configurable logic IP module are implemented to obtain a configurable logic IP RTL. Synthesis and layout for the configurable logic IP module are implemented. The configurable logic IP module is built and debugged. The configurable logic IP module is released to software development.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating an application specific configurable logic IP module in accordance with an exemplary embodiment of the present invention;

FIG. 2 is a schematic diagram illustrating an application specific configurable logic IP module in accordance with an additional exemplary embodiment of the present invention;

FIG. 3 is a schematic diagram illustrating a scalable configurable logic module in accordance with an exemplary embodiment of the present invention;

FIG. 4 is a table illustrating a 5 bit Arithmetic Logic Unit (ALU) of a logic element in accordance with an exemplary embodiment of the present invention;

FIG. 5 shows a logic element in accordance with an exemplary embodiment of the present invention;

FIG. 6 is a schematic diagram illustrating a routing matrix in accordance with an exemplary embodiment of the present invention;

FIGS. 7A and 7B show a switch box in accordance with an exemplary embodiment of the present invention;

FIG. 8 is a flowchart of an ASIC design flow; and

FIG. 9 is a flowchart of a method for integrating a configurable logic IP module into an ASIC design flow in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention provides an application specific configurable logic IP module (configurable module) and a method of integration of a configurable module in an ASIC design. The configurable module itself may use techniques and design flows of the ASIC. The configurable module may be described in Register Transfer Level (RTL) and hence customizable and may be implemented with standard ASIC design tools. Thus, a customer may be able to build the configurable module so that it is optimized for the targeted application.

Application Specific Configurable Logic EP (CL-IP) is a new class of IP designed to eliminate the shortcomings of ASICs and FPGAs. The CL-IP includes an infrastructure to embed configurable logic into state of the art SoC designs. The IP is customizable and synthesizable on in its low level logic fabric, while the system architecture is pre-defined and fixed.

The CL-IP system may include (1) a system level configuration microcontroller; (2) standardized interconnects such as Advanced High-performance Bus (AHB), Advanced eXtensible Interface (AXI), Open Core Protocol (OCP), and the like; (3) a standardized configuration interface such as Joint Test Action Group (JTAG) port, and the like; (4) commonly used logical functions such as memory, adder unit (ADD), multiply-divide unit (MDU), Direct Memory Access (DMA) and the like; (5) an embedded programmable logic fabric; (6) a scalable configurable logic module; (7) a configuration controller; and (8) a routing matrix and routing switches.

The CL-IP as part of a RC or ASIC is capable to provide limited field configurability on system level and on logic level. The CL-IP may be programmed in system over a JTAG port, and the system level and logic level functions may be mapped into the embedded programmable logic fabric. The CL-IP may be reprogrammable and may therefore offer the flexibility of a powerful rapid prototype solution. The system level microcontroller (μC) may be able to select macro functions such as an adder (ADD), a multiplier (MULT), a divider (DWV). Further, the system level microcontroller may select the IP interconnect standard and ports (AHB, AXI, OCP) and the number of embedded programmable logic functions. The system level microcontroller may also control the routing matrix and the switch boxes. The embedded programmable logic fabric may be able to map any arithmetic functions into a number of standard cells.

The CL-IP may also be used as a reconfigurable coprocessor of a general purpose computing machine. The hardware acceleration may achieve speedup ranging from a factor of 2 to as high as a factor of 24 for some applications.

Referring now to FIG. 1, an application specific configurable logic IP module (configurable module) 102 in accordance with an exemplary embodiment of the present invention is shown. The configurable logic IP module 102 includes a system level configuration controller 104. At least one standardized interconnect 108 such as AHB, OCP, and AXI is communicatively coupled to the system level configuration controller 104. The configurable module 102 may include at least one standardized configuration port 106 such as a JTAG port for programming the configurable module 102. An embedded programmable logic fabric 118, communicatively coupled to the system level configuration controller 104 and the standardized interconnect 108, may be used for mapping arithmetic functions into standard cells. The configurable module 102 may include at least one scalable configurable logic module (CLM) 112, which may include a control block (CB) and 16 logic elements (LEs). FIG. 3 shows an exemplary embodiment of the CLM 112, and FIG. 4 is a table illustrating an exemplary 5 bit Arithmetic Logic Unit (ALU) of a logic element. An exemplary logic element is shown in FIG. 5.

Still referring to FIG. 1, the configurable module 102 may include a memory 110, an adder and/or multiplier on R-cell 114, and a programmable routing matrix (not shown in FIG. 1, but see FIG. 6 for an exemplary programmable routing matrix). FIGS. 7A and 7B show an exemplary switch box. The system level configuration controller 104 may be suitable for selecting a standard for the at least one standardized interconnect 108, the at least one standardized configuration port 106, and a number of embedded programmable logic functions, and for controlling the programmable routing matrix. The configurable module 102 may include a co-processor interface 120, an on-chip IP bus 122, and an IP bus 124 for connecting the configurable module 102 to the outside.

FIG. 2 shows an application specific configurable logic IP module (configurable module) 202 in accordance with an additional exemplary embodiment of the present invention. The configurable module 202 may include a system level microcontroller 204; a JTAG port 206; standardized interconnects such as AHB, AXI, OCP 208; memory from RC slice, multiply divide unit, adder 210; and a scalable array of CL modules and scalable routing matrix 212.

FIG. 8 is a flowchart of an ASIC design flow 800. A specification of an integrated circuit product is received 802. The specification may include information such as the application type, application features, target market, technology used, performance expected, embedded IP. Hardware and software partition is implemented based on the specification 804. The product and the addressed features need to be implemented by software or implemented into hardware. Based on the application specific requirements and the product requirement, it is decided which needs to go into hardware.

Architecture of hardware for the integrated circuit product is obtained 806. In this step, it is decided how different hardware components are implemented and connected to each other. The interface to the software and user interfaces (such as monitor, key board etc.) are also decided.

ASIC partition is implemented based on the architecture of hardware to obtain ASIC elements and non-ASIC elements 808. The cores (IP) are selected, and memories are sized. Considerable effort need be applied to seamlessly mapping all of the nonrandom logic elements within the ASIC.

A RTL design for the ASIC is implemented 810. Functional verification of the RTL design is performed 812. Logic synthesis and static timing analysis (STA) are performed 814. The logic synthesis is a technology specific implementation of a function described in RTL (Verilog/VHDL). The STA describes a method to analyze (static mode) the timing response of the implemented function (output from the synthesis step). It is the main method to perform timing verification. Timing verification is performed 816. Product test is performed 818, and test verification is implemented 820. Initial placement is performed 822, and final layout is implemented 824.

Configurable Logic IP (CL-IP) may use the same tools and the same design sources as the ASIC design flow 800 as shown in FIG. 8. Thus, one may need to concentrate on the CL-IP specific deviations from the ASIC design flow. The CL-IP includes three main structural parts: the configuration part, the functional part and the interface part. Only the functional part is customizable. The configuration part and the interface part are pre-defined by the CL-IP module definition itself. From a customer perspective, the functional part of the CL-IP looks similar to the customer RTL. However, the target libraries of the implementation may differ. Once the CL-IP is implemented into silicon, the CL-IP behaves like an FPGA, which is (re)programmable via a JTAG interface.

The process of developing a CL-IP module alongside the development of the ASIC-based end-product requires careful planning at each stage of the flow. For example, after the system has been partitioned into ASIC and non-ASIC elements and after the cores have been selected and memories have been sized, considerable effort need be applied to seamlessly mapping all of the logic elements within the ASIC into a CL-IP module. In some cases, RTL may be designed such that by specifying parameters at compile time, it either represents an ASIC or a CL-IP module realization. The design database may be articulated via "branching" so that an ASIC and a CL-IP module of some design entities may coexist in the same database and the design may be built with one or another branch, depending on whether an ASIC or CL-IP module realization is desired. It may be important to stage the CL-IP module development throughout the ASIC development flow. It may not be desirable to develop and release the CL-IP module prior to considerable verification (simulation) has been accomplished, or wait until full functional verification is complete before starting the development of the CL-IP module.

FIG. 9 is a flowchart of a method 900 for integrating a configurable logic IP module into an ASIC design flow in accordance with an exemplary embodiment of the present invention. The steps 802 through 824 are the same as those shown in FIG. 8. After the step 808, a specific specification for the configurable logic IP module may be provided 930. After the ASIC partitioning exercise is completed, issues such as cores versus custom logic, memory sizing, etc. are resolved, and a complete specification is drafted, three efforts may begin in earnest in parallel: RTL design, test plan and verification environment development, and specifying the deviations to the ASIC RTL design in order to build a derivative with CL-IP. For example, it needs to be considered on how to treat memory structures, how to connect the CL-IP to SoC bus (AMBA, OCP), how to connect to digital cores, how to connect to special IOs, the number of gates of logic needed to be represented by the CL-IP matrix, the acceptable speed for the CL-IP module, the kind of casketing to be utilized to accommodate the slower logic and interface speeds.

Integration of the configurable logic IP module may be implemented 932. After the step 930, which focuses on the specification of the CL-IP modules, the actual integration may be implemented at the step 932. The top-level ASIC RTL instance may include the ASIC, the CL-IP, the I/Os and the connection among each module. Based on the hierarchy level of the CL-IP module, the module interconnect to the rest of the ASIC and to the I/O ports as well as the interconnect to the JTAG module need to be implemented.

After the step 810, RTL enhancements for the configurable logic IP module may be implemented to obtain a configurable logic IP RTL 934. Once the ASIC RTL is well underway (if starting too soon, the job of keeping the ASIC and prototype in sync may prove too daunting), the deviations to the ASIC RTL described above may be implemented. The extent of the deviations may be kept to a bare minimum. Whenever possible, both ASIC and CL-IP RTL may reside in the same source. Thus, when bugs are uncovered downstream they need only be fixed in one place (and the odds that the prototype and the ASIC are functionally equivalent are greater). Since formal RTL to RTL equivalence checking is currently not viable, it is important that a major part of the RTL need be shared by both the ASIC and CL-IP module.

Synthesis and layout for the configurable logic IP module are implemented 936. Up until RTL is completed, the ASIC and FPGA design flows are more or less equivalent. Verilog or VHDL are suitable RTL languages for both. Assuming a no-nonsense coding style is employed, the same RTL may serve equally well for both. CL-IP may operate "near" speed (e.g., half-speed). The methodology of partitioning, synthesizing and layout for an ASIC versus a matrix of CL-IP is similar. The transistor level target library for the synthesis and the layout for the CL-IP may be the same as those for the ASIC logic. However, the CL-IP may be mapped onto a couple of mega-functions such as a 4 Look-Up Table (LUT)-based architecture, which is commonly known by FPGA synthesis and layout tools. This may ensure the reconfigurable function of the CL-IP. Once the customer has specified the configurable part of the CL-IP, all other pre-defined building blocks may come along with it.

The configurable logic IP module is built and debugged 938. The mechanics of how to build and debug a CL-IP is interesting as well as when to do so. Although CL-IP may be built out of ASIC RTL as soon as it is successfully compiled for the first time, it is preferred not to do so (except perhaps to verify that the CL-IP matrix can hold the RTL). A means of regressing both the ASIC and the CL-IP need be established to ensure that the CL-IP and the ASIC represent the same thing. Debug in the lab on real hardware may be hard enough. A kind of hardware debug features is desirable.

The configurable logic IP module may be released to software development 940.

The present invention may have the following advantages. First, CL-IP is a "soft" configurable solution, in which the logic elements are synthesizable and customizable. The IP and infrastructure may be described in Verilog/VHDL RTL. Conventional methods are "hardware" solutions on a physical layer and do not offer customization of the configurability. CL-IP may also offer configurability on a system level. In addition, the CL-EP may be implemented with the existing ASIC and RC design tools and may fit seamlessly into the existing design flows. Moreover, the CL-IP may be instantiated into RC and ASIC similar to a Landing Zone Processor. Further, the present invention may provide a complete solution to the customer: from a Rapid Prototype device type, to a RapidChip with field programmable CL-IP, to a RapidChip with mask programmability, and to a standard cell ASIC solution.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for integrating a configurable logic IP module into an ASIC design flow, comprising:
   receiving a specification of an integrated circuit product, said specification including at least one of an application type, an application feature, a target market, a technology to be utilized, performance expected, and embedded IP;
   implementing hardware and software partition based on said specification;
   obtaining architecture of hardware for said integrated circuit product;
   implementing ASIC partition based on said architecture of hardware to obtain ASIC elements and non-ASIC elements;
   providing a specification for said configurable logic IP module, said configurable logic IP module including a system level configuration controller, at least one standardized interconnect, at least one standardized configuration port, an embedded programmable logic fabric, at least one scalable configurable logic module, and a programmable routing matrix; and
   implementing integration of said configurable logic IP module.

2. The method of claim 1, further comprising:
   implementing a RTL design for said ASIC elements to obtain an ASIC RTL; and
   implementing RTL enhancements for said configurable logic IP module to obtain a configurable logic IP RTL.

3. The method of claim 2, wherein said ASIC RTL and said configurable logic IP RTL reside in a same source.

4. The method of claim 2, wherein at least part of said ASIC RTL and part of said configurable logic IP RTL are same.

5. The method of claim 2, further comprises implementing synthesis and layout for said configurable logic IP module.

6. The method of claim 5, further comprises building and debugging said configurable logic IP module.

7. The method of claim 6, further comprises releasing said configurable logic IP module to software development.

8. The method of claim 2, further comprising:
   performing functional verification on said ASIC elements;

performing timing verification on said ASIC elements; and
performing test verification on said ASIC elements.

9. A computer-readable storage device storing a program for causing a computer to execute a method for integrating a configurable logic IP module into an ASIC design flow, said method comprising:
receiving a specification of an integrated circuit product, said specification including at least one of an application type, an application feature, a target market, a technology to be utilized, performance expected, and embedded IP;
implementing hardware and software partition based on said specification;
obtaining architecture of hardware for said integrated circuit product;
implementing ASIC partition based on said architecture of hardware to obtain ASIC elements and non-ASIC elements;
providing a specification for said configurable logic IP module, said configurable logic IP module including a system level configuration controller, at least one standardized interconnect, at least one standardized configuration port, an embedded programmable logic fabric, at least one scalable configurable logic module, and a programmable routing matrix; and
implementing integration of said configurable logic IP module.

10. The computer-readable medium of claim 9, wherein said method further comprising:
implementing a RTL design for said ASIC elements to obtain an ASIC RTL; and
implementing RTL enhancements for said configurable logic IP module to obtain a configurable logic IP RTL.

11. The computer-readable medium of claim 10, wherein said ASIC RTL and said configurable logic IP RTL reside in a same source.

12. The computer-readable medium of claim 10, wherein at least part of said ASIC RTL and part of said configurable logic IP RTL are same.

13. The computer-readable medium of claim 10, wherein said method further comprises implementing synthesis and layout for said configurable logic IP module.

14. The computer-readable medium of claim 13, wherein said method further comprises building and debugging said configurable logic IP module.

15. The computer-readable medium of claim 14, wherein said method further comprises releasing said configurable logic IP module to software development.

16. The computer-readable medium of claim 10, wherein said method further comprising:
performing functional verification on said ASIC elements;
performing timing verification said ASIC elements; and
performing test verification said ASIC elements.

* * * * *